(12) United States Patent
Schulze et al.

(10) Patent No.: US 8,921,979 B2
(45) Date of Patent: Dec. 30, 2014

(54) METHOD FOR PRODUCING A SEMICONDUCTOR LAYER

(71) Applicant: Infineon Technologies Austria AG, Villach (AT)

(72) Inventors: Hans-Joachim Schulze, Taufkirchen (DE); Helmut Strack, Munich (DE); Hans-Joerg Timme, Ottobrunn (DE); Rainer Winkler, Zorneding (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/071,802

(22) Filed: Nov. 5, 2013

(65) Prior Publication Data

US 2014/0061863 A1 Mar. 6, 2014

Related U.S. Application Data

(63) Continuation of application No. 12/482,101, filed on Jun. 10, 2009, now Pat. No. 8,647,968.

(30) Foreign Application Priority Data

Jun. 10, 2008 (DE) .......................... 10 2008 027 521

(51) Int. Cl.
*H01L 29/06* (2006.01)
*H01L 21/02* (2006.01)
*H01L 21/263* (2006.01)
*C30B 29/06* (2006.01)
*H01L 29/04* (2006.01)
*C30B 33/02* (2006.01)
*H01L 21/322* (2006.01)
*C30B 25/18* (2006.01)

(52) U.S. Cl.
CPC .......... *H01L 29/04* (2013.01); *H01L 21/02381* (2013.01); *H01L 21/263* (2013.01); *C30B 29/06* (2013.01); *H01L 21/02532* (2013.01); *C30B 33/02* (2013.01); *H01L 21/02543* (2013.01); *H01L 21/3225* (2013.01); *H01L 29/0657* (2013.01); *H01L 21/02546* (2013.01); *C30B 25/18* (2013.01); *H01L 21/02658* (2013.01); *H01L 21/02529* (2013.01)
USPC ........................... 257/607; 257/612; 257/618

(58) Field of Classification Search
USPC ......................... 257/607–612, 618
See application file for complete search history.

(56) References Cited

U.S. PATENT DOCUMENTS

| 4,851,358 A | 7/1989 | Huber |
| 5,994,761 A | 11/1999 | Falster et al. |

(Continued)

FOREIGN PATENT DOCUMENTS

| DE | 102006002903 A1 | 8/2007 |
| DE | 69736900 T2 | 9/2007 |

(Continued)

OTHER PUBLICATIONS

Non-Final Office Action mailed May 27, 2010 in U.S. Appl. No. 12/482,101.

(Continued)

*Primary Examiner* — Savitr Mulpuri
(74) *Attorney, Agent, or Firm* — Dicke, Billig & Czaja, PLLC

(57) ABSTRACT

A method for producing a semiconductor layer is disclosed. One embodiment provides for a semiconductor layer on a semiconductor substrate containing oxygen. Crystal defects are produced at least in a near-surface region of the semiconductor substrate. A thermal process is carried out wherein the oxygen is taken up at the crystal defects. The semiconductor layer is deposited epitaxially over the near-surface region of the semiconductor substrate.

14 Claims, 1 Drawing Sheet

(56) References Cited

U.S. PATENT DOCUMENTS

| | | |
|---|---|---|
| 6,022,793 A | 2/2000 | Wijaranakula et al. |
| 6,140,213 A | 10/2000 | Takizawa et al. |
| 6,325,848 B1 | 12/2001 | Watanabe |
| 6,339,011 B1 | 1/2002 | Gonzalez et al. |
| 6,346,460 B1 | 2/2002 | Kononchuk et al. |
| 6,569,749 B1 | 5/2003 | Wijaranakula et al. |
| 7,135,351 B2 | 11/2006 | Binns et al. |
| 7,473,587 B2 | 1/2009 | Bedell et al. |
| 2006/0043470 A1 | 3/2006 | Schulze et al. |
| 2006/0199353 A1 | 9/2006 | Kub et al. |
| 2006/0281263 A1 | 12/2006 | Yamazaki et al. |
| 2007/0216042 A1 | 9/2007 | Delprat et al. |
| 2008/0044669 A1 | 2/2008 | Adachi |
| 2008/0251879 A1 | 10/2008 | Adachi et al. |
| 2008/0315364 A1 | 12/2008 | Nemoto |
| 2009/0004458 A1 | 1/2009 | Falster et al. |
| 2009/0051013 A1 | 2/2009 | Schulze |
| 2009/0102024 A1 | 4/2009 | Takahi et al. |
| 2009/0252974 A1 | 10/2009 | Falster et al. |

FOREIGN PATENT DOCUMENTS

| | | |
|---|---|---|
| EP | 0948037 A1 | 10/1999 |
| WO | 9921222 A1 | 4/1999 |

OTHER PUBLICATIONS

Final Office Action mailed Oct. 25, 2010 in U.S. Appl. No. 12/482,101.

Non-Final Office Action mailed Feb. 8, 2011 in U.S. Appl. No. 12/482,101.

Final Office Action mailed Feb. 23, 2012 in U.S. Appl. No. 12/482,101.

Non-Final Office Action mailed Sep. 5, 2012 in U.S. Appl. No. 12/482,101.

Non-Final Office Action mailed Jun. 12, 2013 in U.S. Appl. No. 12/482,101.

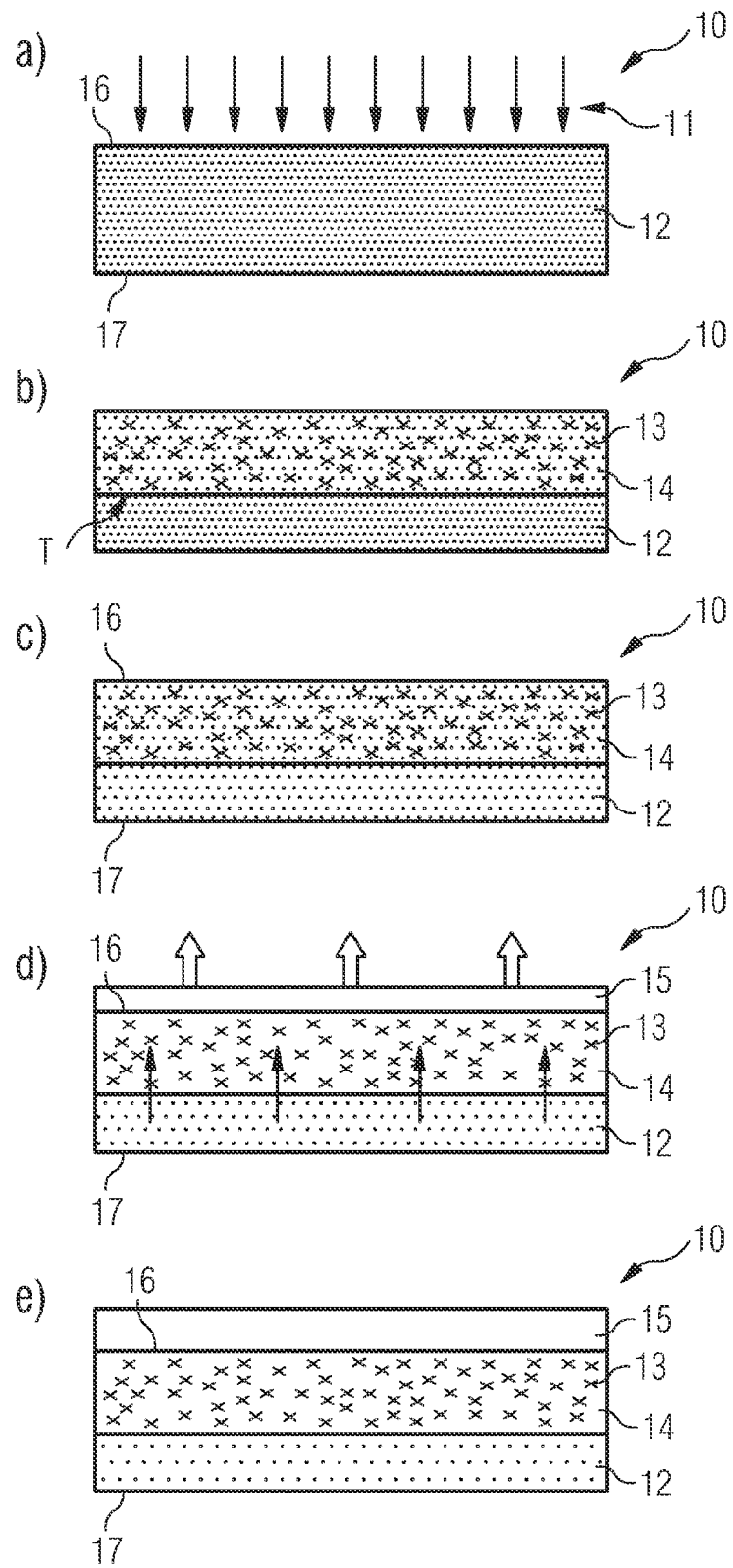

METHOD FOR PRODUCING A SEMICONDUCTOR LAYER

CROSS-REFERENCE TO RELATED APPLICATIONS

This Utility Patent Application is a continuation application of U.S. application Ser. No. 12/482,101, filed Jun. 10, 2009 and claims priority to German Patent Application No. DE 10 2008 027 521.2 filed on Jun. 10, 2008, which is incorporated herein by reference.

BACKGROUND

The present invention relates to a semiconductor device including power semiconductor components and method of making a semiconductor device including an epitaxial deposition of a semiconductor layer on a semiconductor substrate.

For some semiconductor components it is necessary to provide semiconductor layers having different properties one above another. Power semiconductor components that require e.g., a lightly doped semiconductor layer (drift zone), on a highly doped semiconductor substrate layer shall be mentioned here as an example of such semiconductor components. Typical representatives of such power semiconductor components are for example diodes, MOSFETs or IGBTs.

When producing semiconductor layers on a semiconductor substrate, there is a need for the electrical properties of the semiconductor layer to be kept as stable as possible. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1a to e schematically illustrate embodiments of a semiconductor device and method for producing a semiconductor device including producing a semiconductor layer on a semiconductor substrate.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a method for producing a semiconductor including producing a semiconductor layer on a semiconductor substrate wherein the electrical properties of the semiconductor layer are kept as stable as possible. In one embodiment, the semiconductor is a power semiconductor.

One possibility for realizing such a semiconductor layer construction is the epitaxial deposition of a semiconductor layer on a semiconductor substrate. Epitaxy is understood to mean the growth of monocrystalline layers on a likewise monocrystalline substrate.

One embodiment relates to a method for producing a semiconductor including producing a semiconductor layer on an oxygen-containing semiconductor substrate, wherein crystal defects are produced at least in a near-surface region of the semiconductor substrate, at which crystal defects the oxygen is taken up when a thermal process is carried out, and the semiconductor layer is epitaxially deposited over the near-surface region of the semiconductor substrate after the thermal process.

As a result of the oxygen atoms being taken up by the crystal defects produced, the oxygen is locally fixed. Consequently, the oxygen cannot diffuse into the semiconductor layer in subsequent further thermal processes. Such oxygen atoms diffusing into the semiconductor layer could form thermal donors in the semiconductor layer, which would have the consequence of the electrical properties of the semiconductor layer being influenced. By preventing this diffusion of oxygen atoms into the semiconductor layer, the formation of such thermal donors is also prevented and the electrical properties of the semiconductor layer can be kept stable.

FIGS. 1a to e schematically illustrate embodiments of a semiconductor device and method for producing a semiconductor device including producing a semiconductor layer on a semiconductor substrate.

FIG. 1a schematically illustrates the production of crystal defects in a semiconductor substrate 10. The semiconductor substrate 10 is a monocrystalline silicon wafer, for example, which contains oxygen, indicated as dots 12 in FIG. 1a. In this case, the oxygen 12 is situated at interstitial sites in the silicon. Such oxygen-containing silicon semiconductor wafers are generally produced according to the Czochralski (CZ) method, by pulling a silicon single crystal from a silicon melt and slicing the wafers from this pulled single crystal. Such silicon wafers produced according to the Czochralski method generally have an oxygen concentration [Oi] of $3 \times 10^{17}$ to $10^{18}$ interstitial oxygen atoms per $cm^3$. The semiconductor substrate can be provided with a dopant of one conduction type in order to obtain a desired conductivity. By way of example, for readily conductive (low-impedance) semiconductor substrates, the dopant concentration lies in the range of approximately $10^{16}$ $cm^{-3}$ for 1 ohm to approximately $10^{20}$ $cm^{-3}$ for 1 mohm cm. In the case of high-impedance semiconductor substrates with e.g., 100 ohm cm or more, by contrast, only a low dopant concentration of $10^{14}$ $cm^{-3}$ or less is present.

Crystal defects are produced in the semiconductor substrate 10 for example by using high-energy particles. Non-doping particles are typically used as high-energy particles in order not to influence the electrical properties of the semiconductor substrate. Such non-doping particles are, for example, protons, noble gas ions or semiconductor ions, in one embodiment helium ions, neon ions, argon ions, silicon ions, germanium ions or krypton ions. The particles are accelerated to very high velocities, for example, by using an ion accelerator and are subsequently implanted into the semiconductor substrate 10, which is indicated by arrows 11 in FIG. 1a. When these high-energy particles penetrate into the semiconductor substrate, for example vacancies are produced as crystal defects in the crystal lattice. These crystal defects are represented as crosses and designated by the reference symbols 13 in FIG. 1b. The high-energy particles penetrate, for example, from a first surface 16 of the semiconductor substrate 10 into the semiconductor substrate 10 in the direction of a second surface 17, lying opposite the first surface 16, as far as a specific depth T. This penetration depth T, also called "end-of-range", is determined according to the implantation energy of the particles. The higher this energy is chosen to be, the deeper the particles penetrate into the semiconductor substrate 10; in the extreme case, the semiconductor substrate 10 can also be penetrated through completely. In one embodiment, the penetration depth T should be at least 1 μm, and in a further embodiment even at least 5 μm. Consequently, crystal defects 13 are produced at least in a near-surface region 14 in the semiconductor substrate 10, as illustrated schematically in FIG. 1b. However, the crystal defects can also be produced in the entire semiconductor substrate 10 if the high-energy particles completely penetrate through the semiconductor substrate 10.

For sufficient crystal defect production by using protons, the radiation dose of the implantation is set for example to $1 \times 10^{13}$ cm$^{-2}$ to $1 \times 10^{15}$ cm$^{-2}$.

After the production of the crystal defects 13 in at least the near-surface region 14 of the semiconductor substrate 10, a thermal process is carried out at the semiconductor substrate 10. During this thermal process, the interstitial oxygen atoms 12 are taken up at the crystal defects 13. The concentration of the free interstitial oxygen atoms 12 in the semiconductor substrate 10 is therefore considerably reduced, which is illustrated schematically in FIG. 1c by a smaller number of the dots 13 that are intended to indicate the interstitial oxygen atoms. In this case, the thermal process includes heating the semiconductor substrate to temperatures between 700° C. and 1100° C. The duration of the thermal process is chosen to be between 1 hour and 30 hours.

In one embodiment, provision is made, for example, for heating the semiconductor substrate 10 during the thermal process firstly for a first time duration, which is shorter than 10 hours, to a temperature of between 750° C. and 850° C. and subsequently for a second time duration, which is longer than 10 hours, to a temperature of between 950° C. and 1050° C. In one embodiment, 5 hours can be chosen for the first time duration and 20 hours for the second time duration. One embodiment provides for exposing the semiconductor substrate 10 to an inert atmosphere, an atmosphere that does not promote oxidation, such as e.g., a nitrogen atmosphere, during the thermal process for the oxygen atoms 12 to be taken up by the crystal defects 13. In one embodiment, provision can be made for additionally adding a chlorine-containing compound to this inert atmosphere.

As illustrated schematically in FIG. 1d, after the thermal process, a semiconductor layer 15 is grown over the near-surface region 14 of the semiconductor substrate 10. The semiconductor layer 15 is produced in monocrystalline fashion by epitaxial deposition of a semiconductor material. All customary semiconductor materials such as e.g., silicon, germanium, gallium arsenide, indium phosphide or silicon carbide can be used as the semiconductor material. The most insignificant problems with regard to lattice mismatches occur if the same semiconductor material as that of the semiconductor substrate 10 is used. Thus, in general on a silicon semiconductor substrate 10 a silicon semiconductor layer 15 is also produced over the near-surface region 14.

The temperatures that occur during the growth phase (indicated by thick arrows at the semiconductor layer 15 in FIG. 1d) bring about a diffusion of still free interstitial oxygen atoms 12 (indicated as thin arrows in the near-surface region 14 in FIG. 1d). In one embodiment, the diffusion takes place principally from the region of the semiconductor substrate which has no crystal defects in the direction of the crystal defects or the oxygen atoms already taken up thereby (oxygen precipitates). In one embodiment, these diffusing oxygen atoms are likewise taken up by the crystal defects 13. The oxygen precipitates therefore increase in size. An outdiffusion of oxygen atoms 12 from the semiconductor substrate 10 into the semiconductor layer 15 produced can thereby be prevented or at least greatly suppressed. Consequently, a possible later formation of thermal donors from interstitial oxygen atoms present in the semiconductor layer 15 can also be prevented or at least greatly reduced. Uncontrolled and undesirable influencing of the electrical properties of the semiconductor layer 15 produced can therefore be avoided at least for the most part.

A semiconductor device including a semiconductor layer 15 produced according to the method described above on an oxygen-containing semiconductor substrate 10 is illustrated schematically in a cross-sectional view in FIG. 1e. The semiconductor layer 15 was produced with defined properties. The semiconductor layer 15 can have an electrical conductivity e.g., by being lightly doped with a dopant. Such a semiconductor layer 15 is used for example as a drift zone or base zone for a power semiconductor component. Especially for power semiconductor components which have to have a counter-compensation of the dopants that is as exact as possible (compensation components), it is important to exactly comply with the doping in the semiconductor layer 15. The method presented is also suitable for complying with this condition.

One embodiment provides for the semiconductor layer 15 to be deposited on the first surface 16 of the semiconductor substrate 10. In this case, the semiconductor layer 15 is directly in contact with the near-surface region 14 in which the crystal defects 13 with the oxygen atoms 12 taken up thereby are produced. Consequently, the oxygen atoms 12 bound in these oxygen precipitates cannot diffuse into the semiconductor layer 15.

One embodiment provides for the semiconductor layer 15 to be deposited on the second surface 17. For this purpose, however, it is necessary that the previously produced crystal defects 13 reach at least as far as 3 μm to the second surface 17. This is the longest range of the gettering effect which the oxygen precipitates produced at the crystal defects can exert on the free interstitial oxygen atoms 12. Therefore, it is also necessary for this variant that the region 14 of the semiconductor substrate 10 through which the high-energy particles penetrate ends at most 3 μm before the second surface 17 of the semiconductor substrate 10. In other words, the "end-of-range" T should be a maximum of 3 μm away from the second surface 17. Only then is it ensured that all the free interstitial oxygen atoms 12 can be taken up by crystal defects before or during the production of the semiconductor layer 15.

One embodiment provides for the semiconductor substrate 10 to be exposed to a further thermal process prior to the irradiation with high-energy particles. In one embodiment, the semiconductor substrate 10 is heated to a temperature of greater than 1050° C. and exposed to an inert atmosphere, for example. One exemplary embodiment provides a nitrogen-containing atmosphere for this purpose. This thermal process is intended to bring about an outdiffusion of the free interstitial oxygen atoms 12 from the near-surface regions of the semiconductor substrate in order thus already to free the near-surface regions of the semiconductor substrate 10 of free interstitial oxygen atoms 12. One embodiment provides for the "end-of-range" to end in the middle of the semiconductor substrate 10 and for the semiconductor substrate to be thinned at the second surface 17 until the second surface is a maximum of 3 μm away from the "end-of-range". Another embodiment provides for the implantation energy of the high-energy particles to be chosen in such a way that the "end-of-range" is automatically already a maximum of 3 μm away from the second surface 17. An additional thinning of the semiconductor substrate is therefore unnecessary.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor comprising:
   a semiconductor substrate containing oxygen, the semiconductor substrate having first surface and a second surface opposite to the first surface;
   protons implanted in at least a near-surface region adjacent to the first surface of the semiconductor substrate;
   crystal defects produced by the protons, the crystal defects locally fixing oxygen in the form of oxygen precipitates within the near-surface region of the semiconductor substrate; and
   an epitaxial semiconductor layer directly contacting the first surface of the semiconductor substrate,
   wherein a concentration of oxygen precipitates is greater within the near-surface region of the semiconductor substrate than within a region of the semiconductor substrate adjacent to the second surface.

2. The semiconductor of claim 1, wherein the semiconductor substrate is a monocrystalline silicon wafer.

3. The semiconductor of claim 2, wherein the silicon wafer is produced according to the Czochralski method.

4. The semiconductor of claim 1, wherein the radiation dose of the protons is between $1 \times 10^{13} cm^{-2}$ to $1 \times 10^{15} cm^{-2}$.

5. The semiconductor of claim 1, wherein a penetration depth T of the protons into the semiconductor substrate is at least 1 μm.

6. The semiconductor of claim 5, wherein the penetration depth T is at least 5 μm.

7. The semiconductor of claim 1,
   wherein the penetrated region of the semiconductor substrate ends at most 3 μm before the second surface.

8. A semiconductor comprising:
   a semiconductor substrate containing oxygen, the semiconductor substrate having a first surface and a second surface opposite to the first surface;
   protons implanted in at least a near-surface region adjacent to the first surface of the semiconductor substrate;
   crystal defects produced by the protons, the crystal defects locally fixing oxygen in the form of oxygen precipitates within the near-surface region of the semiconductor substrate;
   an epitaxial semiconductor layer directly contacting the first surface of the semiconductor substrate; and
   a power semiconductor formed in the semiconductor layer and semiconductor substrate,
   wherein a concentration of oxygen precipitates is greater within the near-surface region of the semiconductor substrate than within a region of the semiconductor substrate adjacent to the second surface.

9. The semiconductor of claim 8, wherein the semiconductor substrate is a monocrystalline silicon wafer.

10. The semiconductor of claim 9, wherein the silicon wafer is produced according to the Czochralski method.

11. The semiconductor of claim 8, wherein the radiation dose of the protons is between $1 \times 10^{13} cm^{-2}$ to $1 \times 10^{15} cm^{-2}$.

12. The semiconductor of claim 8, wherein a penetration depth T of the protons into the semiconductor substrate is at least 1 μm.

13. The semiconductor of claim 12, wherein the penetration depth T is at least 5 μm.

14. The semiconductor of claim 8,
   wherein the penetrated region of the semiconductor substrate ends at most 3 μm before the second surface.

* * * * *